United States Patent [19]

Linna et al.

[11] Patent Number: 5,042,070
[45] Date of Patent: Aug. 20, 1991

[54] AUTOMATICALLY CONFIGURED AUDIO SYSTEM

[75] Inventors: Dennis J. Linna, Livonia; Robert L. Focht, Farmington Hills; Daniel T. Donaldson, Canton, all of Mich.

[73] Assignee: Ford Motor Company, Dearborn, Mich.

[21] Appl. No.: 590,868

[22] Filed: Oct. 1, 1990

[51] Int. Cl.$^5$ .......................................... H04R 29/00
[52] U.S. Cl. ........................................ 381/59; 381/96; 381/109
[58] Field of Search .................... 381/55, 59, 96, 104, 381/107, 109, 28, 120

[56] References Cited

U.S. PATENT DOCUMENTS

| | | |
|---|---|---|
| 4,320,255 | 3/1982 | Null et al. |
| 4,528,686 | 7/1985 | Dressler ............................ 381/28 |
| 4,817,194 | 3/1989 | Andros, Jr. |
| 4,823,283 | 4/1989 | Diehm et al. |

FOREIGN PATENT DOCUMENTS

| | | | |
|---|---|---|---|
| 2402028 | 7/1975 | Fed. Rep. of Germany ...... | 381/107 |
| 0218100 | 12/1984 | Japan ................................ | 381/107 |
| 0216695 | 10/1985 | Japan ................................ | 381/59 |

OTHER PUBLICATIONS

Sony Autosound, Catalog, 4/89.

*Primary Examiner*—Jin F. Ng
*Assistant Examiner*—Sylvia Chen
*Attorney, Agent, or Firm*—Mark Mollon; Paul K. Godwin

[57] ABSTRACT

An audio system has menu-driven controls using a select button to scan through possible functions and uses up and down adjustment buttons to modify the selected function. The menu of selected functions is automatically altered according to the presence of front and rear speakers to avoid any confusion from presenting a fade function on the menu when in fact there are not both front and rear speakers connected to the system.

9 Claims, 2 Drawing Sheets

AUTOMATICALLY CONFIGURED AUDIO SYSTEM

BACKGROUND OF THE INVENTION

The present invention relates in general to a menu controlled audio system, and more specifically to automatically altering a system menu according to the features available to the audio system.

As a result of improvements in electronics, present-day audio systems incorporate many features and functions associated with different audio sources such as a radio, tape player, or compact disc player, and associated with the processing of the audio signal such as noise reduction, volume, balance, fade, and tone control. As the number of functions have increased, the number of control buttons on the radio have also increased. User confusion arises because of a large number of small buttons and labels which are hard to read or decipher.

Control of the audio system can be simplified by using a select button to scan through the possible functions to be adjusted in conjunction with up and down adjustment buttons to adjust the currently selected function. The currently selected function is displayed on a control panel so that repeated pressing of the select button scans the entire menu of functions available in the audio system. After periods of inactivity, the selected function may automatically default to the most frequently used one, such as volume control.

In manufacturing large quantitites of various models or configurations of automotive audio systems, it is less expensive to employ common electronic chassis and other components in the different models or system configurations. For example, a single model audio system may be used with either two or four speakers depending on the vehicle in which it is installed. Thus, while one vehicle may have only a front set of stereo speakers installed, another vehicle may have both front and rear sets of stereo speakers. A single model audio system is used in either configuration since it would be more expensive to produce separate two and four speaker models.

One of the selectable functions, when there are front and rear speakers, is the fade function which controls the relative gain between the front and rear sets of speakers. However, in the two speaker configuration, the user can be confused by the appearance of the fade function on the menu since the function is not really available. Therefore, the different configurations would at least require a change in programming to avoid confusion with regard to the menu.

SUMMARY OF THE INVENTION

Accordingly, it is a principal object of the present invention to provide a method and apparatus for displaying only the available functions on a selection menu.

It is another object of the present invention to detect the presence or nonpresence of a speaker connected to an output of an audio system.

It is a further object of the present invention to provide an audio system for automatically configuring a function selection menu to the speaker configuration of the system.

These and other important objects are achieved according to the present invention by employing a sensing circuit which detects the presence or nonpresence of a speaker. When power is first applied to the audio system, speaker presence is detected and the function selection menu of the audio system is configured to include a fade function only if front and rear speakers are present.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings, in which:

DETAILED DESCRIPTION OF PREFERRED EMBODIMENTS

Figure 1:
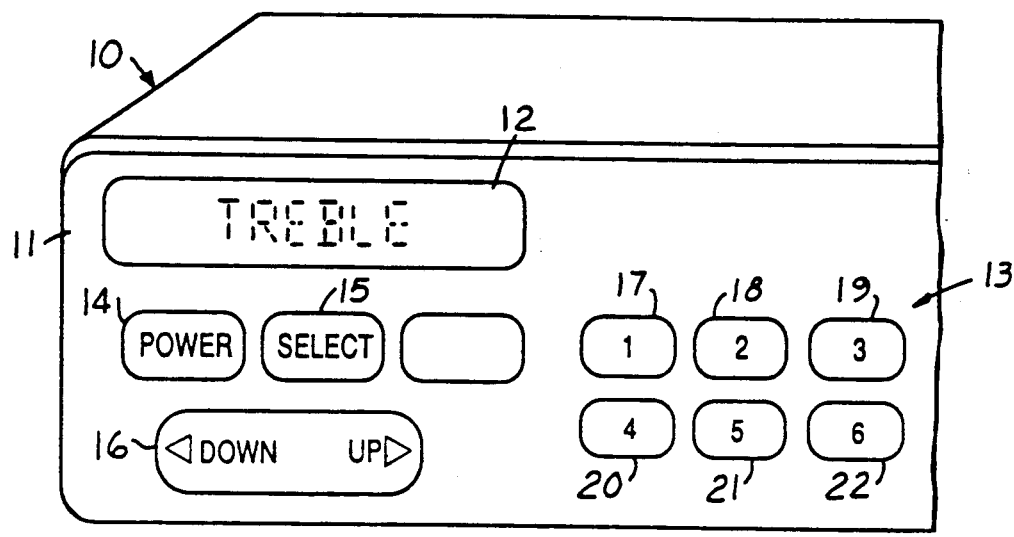
FIG. 1 is a partial front perspective view of the front face of an audio system including a menu driven function selection.

FIG. 1 shows an audio receiver 10 having a front bezel 11. A display 12 may be comprised of a vacuum fluorescent (VF) display or a liquid crystal display (LCD) wherein various segments in the display can be illuminated to form messages.

Receiver 10 further includes a plurality of control buttons 13 including a Power button 14 and a select button 15. An adjustment button 16 is comprised of a rocker switch for making downward and upward (i.e., −/+) adjustments by depressing opposite ends thereof. Radio station present buttons 17-22 are associated with first through sixth radio frequency presets.

In operation, each successive push of select button 15 sequentially selects audio functions such as bass level, treble level, left/right balance, and front/rear fade. Balance and fade relate to the relative gain in left/right and front/rear channels, respectively.

Whenever select button 15 has not recently been depressed (e.g., within two seconds), adjustment button 16 may preferably control volume in a default mode. Depressing select button 15 cycles through the other audio functions in a predetermined sequential order. It may be desirable to arrange the selection procedure such that when select button 15 is first pressed, the first function to appear will be the last one which was adjusted. For example, if bass level was the last audio function to be adjusted and adjustment button 16 has returned to its default volume adjustment mode, then the next time that select button 15 is pushed the selection menu sequence will start with bass level.

The function currently selected for adjustment is indicated in display 12, e.g., by displaying one of the words "BASS", "TREBLE", "BALANCE", or "FADE". After two seconds without any adjustment being performed, any function name is removed from display 12 and adjustment button 16 returns to its volume adjustment mode.

When select button 15 is pressed, the up and down symbols on adjustment button 16 can be lit to indicate that that button is to be used to adjust the function shown in the menu display. When adjustment button 16 is pressed, the function name shown in display 12 is replaced by a bar graph (not shown in the FIG.) in which segments are illuminated extending left or right from the center of the display in accordance with the Present value of the function being adjusted relative to a predefined normal value.

Figure 2:
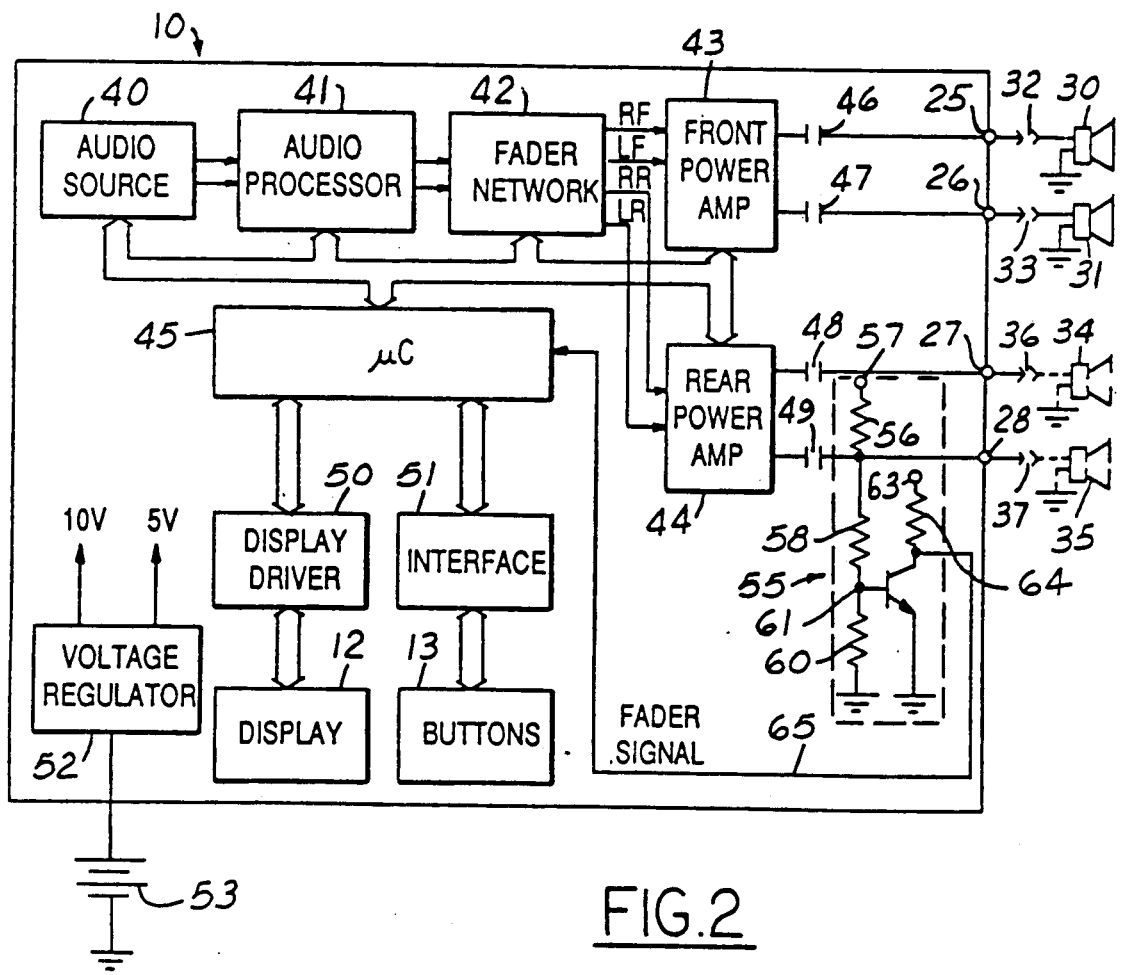
FIG. 2 is a schematic diagram of an audio system according to the present invention.

As shown in FIG. 2, receiver 10 is configured to be connected to either one or two pairs of speakers. Stereo output terminals 25 and 26 are provided for a first pair of speakers 30 and 31 (usually the front speakers if in an automotive vehicle), respectively, connected to the receiver through wiring harness connectors 32 and 33. Stereo output terminals 27 and 28, respectively, can be connected to a second pair of speakers 34 and 35 (such as optional r (R)ar speakers in an automotive vehicle), if provided, through harness connectors 36 and 37. Receiver 10 is constructed such that the presence (i.e., interconnection) of the second set of speakers 34 and 35 is detected and the function menu is correspondingly configured to either include or not include a fade function, as appropriate.

Receiver 10 includes an audio source 40 which may be comprised of an AM/FM radio, a tape player, and/or a compact disc player which provides a stereo audio signal to an audio processor 41. The volume, tone, and balance of the stereo audio signal is controlled by audio processor 41. These stereo signals are then provided to a fader network 42 which controls the relative magnitude of front and rear stereo signals provided to a front power amplifier 43 and a rear power amplifier 44. A microcontroller 45 is connected to audio source 40, audio processor 41, fader network 42, front power amplifier 43, and rear power amplifier 44 for controlling operation of the receivers. Microcontroller 45 includes a microprocessor and a stored program and may be comprised of a COP888CG microcontroller available from National Semiconductor Corporation, for example.

Front power amplifier 43 has stereo outputs connected to speaker outputs 25 and 26 through output capacitors 46 and 47, respectively. Rear power amplifier 44 has stereo outputs connected to speaker outputs 27 and 28 through output capacitors 48 and 49, respectively.

Microcontroller 45 is further connected to a display driver 50 which drives display 12. An interface 51 interconnects microcontroller 45 with buttons 13. A voltage regulator 52 may be connected to a car battery 53 and provides various output voltages such as 10 volts and 5 volts for use by receiver 10.

In order to allow receiver 10 to automatically configure itself according to whether the rear set of speakers 34 and 35 are in fact connected, a speaker sensing circuit 55 is provided. Since it is sufficient to detect the presence of one rear speaker, speaker sensing circuit 55 is shown as only being connected to speaker output terminal 28.

Speaker sensing circuit 55 includes a resistor 56 having one side connected to speaker terminal 28 and the other side connected to a voltage terminal 57 providing +5 volts, for example. A voltage divider comprised of a pair of resistors 58 and 60 is connected in series between speaker terminal 28 and ground. An npn transistor 62 has its base connected to a junction 61 between resistors 58 and 60 and its emitter connected to ground. The collector of transistor 62 is connected to one side of a resistor 64 and to an input terminal of microcontroller 45 via a fade signal line 65. The other side of resistor 64 is connected to a voltage terminal 63, also preferably providing +5 volts.

In operation, microcontroller 45 unmutes rear power amplifier 44 so that the output connected to capacitor 49 is biased to approximately one-half of the maximum (i.e., battery) voltage. Of course, there should be no audio signal input to rear power amplifier 44 during this procedure (i.e., audio processor 41 should be muted). If there is no speaker 35 connected to speaker output 28, then the voltage on capacitor 49 will be held there through high impedance pull-up resistor 56. The voltage at junction 61 of the voltage divider then turns on transistor 62 such that a fader line 65 provides a fader signal at a low logic level which is read by microcontroller 45 as an indication that there is no rear speaker. Transistor 62 and the voltage divider thus compare the voltage on capacitor 49 with a threshold voltage determined by the resistance values of resistors 58 and 60 and by the turn-on voltage of transistor 62.

If a speaker 35 is connected to speaker output 28, then the initial charge on capacitor 49 is drained away very quickly through speaker 35. The voltage at speaker output terminal 28 is then held at substantially zero volts so that transistor 62 becomes nonconducting and the signal on fade signal line 65 is a high logic level which indicates to microcontroller 45 that rear speakers are connected to the receiver. Microcontroller 45 is programmed such that a high fader signal causes the fade function to appear on the function selection menu while a low fader signal prevents the fade function from appearing on the menu.

The procedure for identifying the presence or absence of a rear speaker need only be performed upon initial power-up of receiver 10 (i.e., when battery 53 is first connected).

In order to ensure proper reading of the fader signal, at least about three seconds should be provided between the time that rear power amplifier 44 is unmuted and microcontroller 45 reads the high or low level signal on fader line 65. This delay allows the voltage on capacitor 49 to stabilize.

Figure 3:
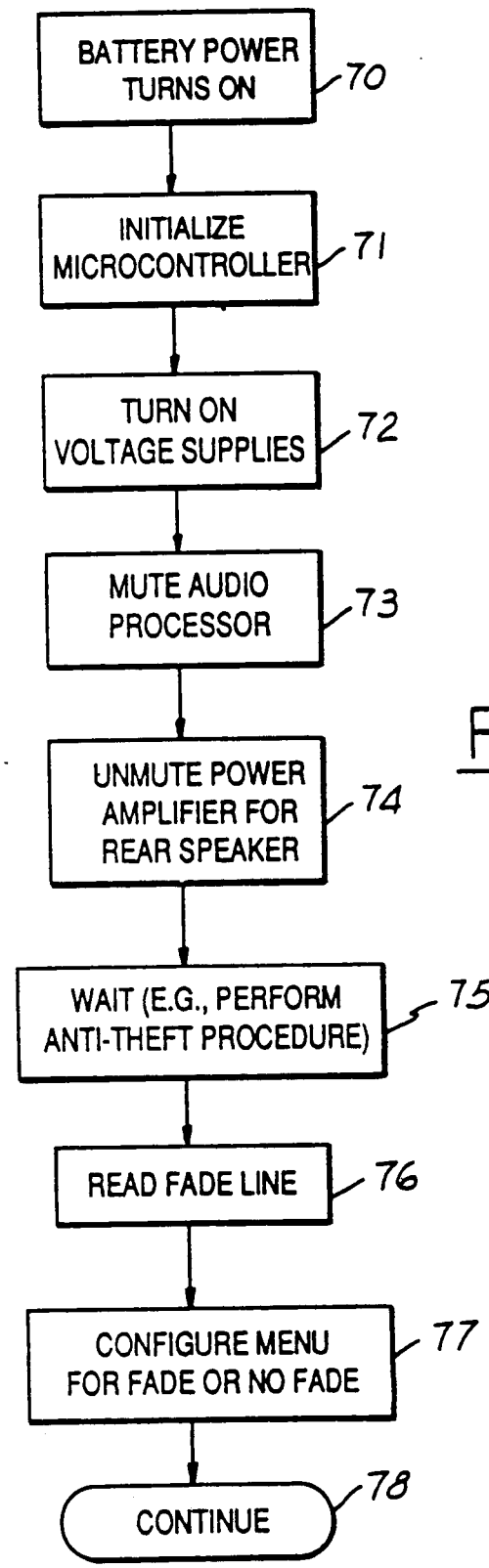
FIG. 3 is a flow chart showing a preferred method of the present invention.

FIG. 3 shows a preferred method of implementing the invention. In step 70, initial battery power is connected to the receiver such as when the receiver is installed into a vehicle. After battery power is initiated, the microcontroller is initialized in step 71. In step 72, the voltage regulator turns on the various voltage supplies to the circuits in the receiver.

The audio processor is muted in step 73 so that no audio signals can reach the rear power amplifier. In step 74, the rear power amplifier is unmuted so that its output is biased to one-half the maximum voltage.

In step 75, a delay of at least about three seconds is performed in order to allow the voltages to stabilize. In a preferred embodiment, the delay is achieved by entering an anti-theft routine which is normally performed on initial power-up of the receiver. Thus, a user must enter a code (e.g., using radio station preset buttons shown in FIG. 1) which matches a code stored in microcontroller 45, known only to the rightful owner of the receiver. Since the anti-theft procedure will take at least three seconds to perform, it is conveniently used to insert the needed delay to allow stabilzing of the speaker sensing circuit.

In step 76, the microcontroller reads the fade signal line as the indication of the presence or absence of rear speakers. The function selection menu is configured in step 77 to include the fade function if the fader signal was high and to not include the fade function if the fader signal was low. Normal operation of the receiver continues in step 78.

The voltages supplied to speaker sensing circuit 55 can be turned off if desired. If not turned off, a small bias voltage will be provided to speaker output 28 which has a negligible effect on audio performance.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. Audio apparatus comprising:
   power amplifier means having an output for selectively connecting to a speaker;
   speaker sensing means coupled to said power amplifier output for providing a signal indicating when a speaker is and is not connected to said power amplifier output;
   function selection means for sequentially selecting from a plurality of audio functions for adjustment, said audio functions including a relative gain function for adjustment of the gain of said power amplifier means;
   display means for displaying each of said audio functions as they are selected for adjustment; and
   control means coupled to said speaker sensing means, said function selection means, and said display means for preventing selection and display of said relative gain function as one of said audio functions when said speaker sensing means provides a signal indicating that no speaker is connected to said power amplifier output.

2. The apparatus of claim 1 wherein said apparatus comprises a four channel audio system having front and rear channels and wherein said gain adjustment corresponds to a fade function between said front and rear speakers.

3. The apparatus of claim 1 wherein said speaker sensing means is comprised of:
   a voltage supply;
   a resistance coupling said voltage supply to said power amplifier output;
   a voltage divider coupled to said power amplifier output; and
   comparison means coupled to said voltage divider for providing said indicating signal depending on a voltage from said voltage divider.

4. The apparatus of claim 3 wherein said comparison means is comprised of a transistor having its control input connected to said voltage divider and having an output connected to said control means.

5. The apparatus of claim 1 wherein said control means is comprised of a microprocessor.

6. A method for determining the presence of a rear speaker in an automotive audio system having a power amplifier for driving said rear speaker, said method comprising the steps of:
   connecting the output of said power amplifier to a voltage supply through a resistance;
   unmuting said power amplifier;
   waiting for a predetermined time to allow the voltage at said power amplifier output to stabilize; and
   indicating the presence or nonpresence of a rear speaker depending on said voltage at said Power amplifier output.

7. A method of operating a menu-driven automotive audio system including a menu display, a function selector, and a power amplifier for driving a rear speaker if present, said method comprising the steps of:
   connecting the output of said power amplifier to a voltage supply through a resistance;
   unmuting said power amplifier;
   waiting for a predetermined time to allow the voltage at said power amplifier output to stabilize;
   indicating the presence or nonpresence of a rear speaker depending on said voltage at said power amplifier output;
   displaying one of a plurality of audio functions on said menu display;
   sequencing to the display of another one of said audio functions in response to actuation of said function selector; and
   preventing display of any audio function requiring a rear speaker if the nonpresence of a rear speaker is indicated.

8. The method of claim 7 wherein said waiting step is comprised of conducting an anti-theft procedure in which a predetermined anti-theft code is input to said audio system by a system user.

9. Audio apparatus comprising:
   power amplifier means having a plurality of outputs for connecting to a plurality of speakers;
   speaker sensing means coupled to said power amplifier means for providing a signal indicating when a speaker is and is not connected to one of said power amplifier outputs;
   function selection means for sequentially selecting from a plurality of audio functions for adjustment, said audio functions including a relative gain function for adjustment of the gain to be provided for said one power amplifier output relative to the gain to be provided for another one of said Power amplifier outputs;
   display means for displaying each of said audio functions as they are selected for adjustment; and
   control means coupled to said speaker sensing means, said function selection means, and said display means for Preventing selection and display of said relative gain function as one of said audio functions when said speaker sensing means Provides a signal indicating that no speaker is connected to said one power amplifier output.

* * * * *